US011032954B2

(12) United States Patent
Klein et al.

(10) Patent No.: US 11,032,954 B2
(45) Date of Patent: Jun. 8, 2021

(54) SHIELD CAN

(71) Applicant: Microsoft Technology Licensing, LLC, Redmond, WA (US)

(72) Inventors: Stephen C. Klein, Kirkland, WA (US); Todd David Pleake, Sammamish, WA (US); Daniel M. Galel, Redmond, WA (US); Ivan Andrew McCracken, Sammamish, WA (US); Mark Mitchell Gloster, Redmond, WA (US); Duane Martin Evans, Snohomish, WA (US); Tony N. Kfoury, Lisle, IL (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/705,800

(22) Filed: Dec. 6, 2019

(65) Prior Publication Data

US 2020/0113092 A1 Apr. 9, 2020

Related U.S. Application Data

(60) Continuation of application No. 15/357,890, filed on Nov. 21, 2016, now Pat. No. 10,542,643, which is a division of application No. 14/033,320, filed on Sep. 20, 2013, now abandoned.

(60) Provisional application No. 61/759,962, filed on Feb. 1, 2013.

(51) Int. Cl.
*H05K 1/14* (2006.01)
*G06F 1/16* (2006.01)
*G06F 1/18* (2006.01)
*H05K 9/00* (2006.01)
*H05K 3/20* (2006.01)

(52) U.S. Cl.
CPC ......... *H05K 9/0032* (2013.01); *G06F 1/1626* (2013.01); *G06F 1/182* (2013.01); *H05K 1/147* (2013.01); *H05K 3/20* (2013.01); *H05K 2201/10371* (2013.01); *Y10T 29/49128* (2015.01)

(58) Field of Classification Search
CPC ........ H05K 9/0032; H05K 1/147; H05K 3/20; H05K 2201/10371; G06F 1/1626; G06F 1/182; Y10T 29/49128
See application file for complete search history.

(56) References Cited

U.S. PATENT DOCUMENTS

| 5,495,399 | A | * | 2/1996 | Gore | H05K 9/0032 174/354 |
| 6,552,261 | B2 | * | 4/2003 | Shlahtichman | H05K 9/0032 174/363 |
| 7,038,124 | B1 | * | 5/2006 | Sosnowski | H05K 9/0041 174/377 |
| 2002/0185294 | A1 | * | 12/2002 | Shlyakhtichman | H05K 9/0032 174/384 |

(Continued)

*Primary Examiner* — Abhishek M Rathod
(74) *Attorney, Agent, or Firm* — Rainier Patents, P.S.

(57) ABSTRACT

A shield can assembly is described. In one or more implementations, a frame is installed on a printed circuit board (PCB) by using a cross-bar connected to opposing sides of the frame to place the frame on the PCB. Subsequent to installation of the frame on the PCB, the cross-bar is removed from the frame. Once the cross-bar is removed, one or more flexible printed circuits (FPCs) are installed on the PCB. Then, a lid is connected to the frame to from a shield can over the FPCs.

20 Claims, 16 Drawing Sheets

Isometric view of the two-part Shield Can Assembly

(56) References Cited

U.S. PATENT DOCUMENTS

| | | | | |
|---|---|---|---|---|
| 2003/0081398 A1* | 5/2003 | Tuttle | ............... | H05K 9/0016 |
| | | | | 361/818 |
| 2008/0179086 A1* | 7/2008 | English | ............ | H05K 9/0032 |
| | | | | 174/384 |
| 2010/0061584 A1* | 3/2010 | Lin | ............... | H04R 1/02 |
| | | | | 381/386 |
| 2010/0246143 A1* | 9/2010 | Dinh | ............ | H05K 9/0028 |
| | | | | 361/748 |
| 2012/0113601 A1* | 5/2012 | Kohara | ............ | H05K 9/0032 |
| | | | | 361/736 |
| 2012/0262889 A1* | 10/2012 | Tsao | ............ | H05K 9/0032 |
| | | | | 361/752 |
| 2012/0285737 A1* | 11/2012 | Judy | ............ | H05K 9/0043 |
| | | | | 174/381 |
| 2013/0033843 A1* | 2/2013 | Crotty, Jr. | ............ | H05K 9/0032 |
| | | | | 361/807 |
| 2013/0120957 A1* | 5/2013 | Werner | ............ | H05K 3/225 |
| | | | | 361/818 |
| 2013/0148318 A1* | 6/2013 | Kim | ............ | H05K 9/0032 |
| | | | | 361/759 |

\* cited by examiner

Isometric view of the two-part Shield Can Assembly

Cross-sectional view of the Frame showing the crossbar shape.

Isometric view of the Frame with Crossbar and with Crossbar removed.

Isometric view of the Shield Can Assembly as placed on a PCB

Cross-sectional view of the Shield Can Assembly showing relative positions of shielded Component and Shield Can Assembly.

Cross-sectional view of the Shield Can Assembly and shielded component.

1300

SHIELD CAN

RELATED APPLICATIONS

This application is a continuation of and claims priority under 35 U.S.C. § 120 to U.S. patent application Ser. No. 15/357,890, filed on Nov. 21, 2016, entitled "Shield Can", which is a divisional of and claims priority under 35 U.S.C. § 120 to U.S. Patent application Ser. No. 14/033,320, filed on Sep. 20, 2013, entitled "Shield Can", and U.S. Provisional Patent Application No. 61/759,962, filed Feb. 1, 2013, entitled "Battery Connections, Clip Shields, Housing and PCBs, and Shield Cans", the disclosures of each of which are incorporated by reference in their entirety.

BACKGROUND

Designs for computing devices are ever changing. However, these designs are often limited by hardware components which enable device functionality. For example, hardware components affect certain aspects of a design, such as size, structure, and/or robustness.

In one example, a device may include one or more components that require electromagnetic shielding to prevent interference with other components of the device. As these devices become thinner, the internal components of the devices continue to require electromagnetic shielding. However, typical shielding solutions for electronic devices may limit the internal and/or external structure of the electronic devices because of current manufacturing techniques.

SUMMARY

A shield can is described. In one or more implementations, a shield can includes a frame configured to be installed on a printed circuit board (PCB). The shield can also includes a lid configured to be connected to the frame after installation of the frame to form the shield can over one or more components that are installed on the PCB.

In one or more implementations, a computing device includes one or more components configured to produce an electromagnetic field. The computing device also includes a shield can configured to provide an electromagnetic shield for the one or more components. The shield can includes a lid connected to a frame that is installed on a PCB.

In one or more implementations, a method includes connecting a frame to a PCB. In addition, one or more flexible printed circuits (FPCs) are installed on the PCB. Further, a lid is connected to the frame to form a shield can over the one or more FPCs.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Conventional techniques that were used to construct electromagnetic shielding of electronic components of computing devices may limit certain aspects of the computing devices, such as size and/or mechanical robustness, at least by affecting the computing device's internal and/or external structure. For example, previous typical solutions required an increase in height in order to avoid interference between the shielding can and the components to be shielded.

Accordingly, techniques are described herein in which a two-piece electromagnetic shielding can achieves a low height with respect to typical shielding solutions which are soldered to a PCB. A lowest-profile design may be used to minimize overall thickness of the computing device, such as a hand-held personal computing device or tablet. The shielding design may be Pick and Place compatible, as well as Surface Mount Technology (SMT) compatible. In addition, the shielding design may include a non-conductive inner surface to avoid electrically shorting shielded electronic components, and a removable lid in order to allow for rework and/or process/manufacturing troubleshooting. Further discussion of this and other examples may be found in the following section.

In the following discussion, an example environment is first described that may employ the techniques described herein. Following this, example device components are described which may be used to employ the techniques described herein. Example procedures are then described which may be performed in the example environment as well as other environments. Consequently, performance of the example procedures is not limited to the example environment and the example environment is not limited to performance of the example procedures.

Example Environment

Figure 1:
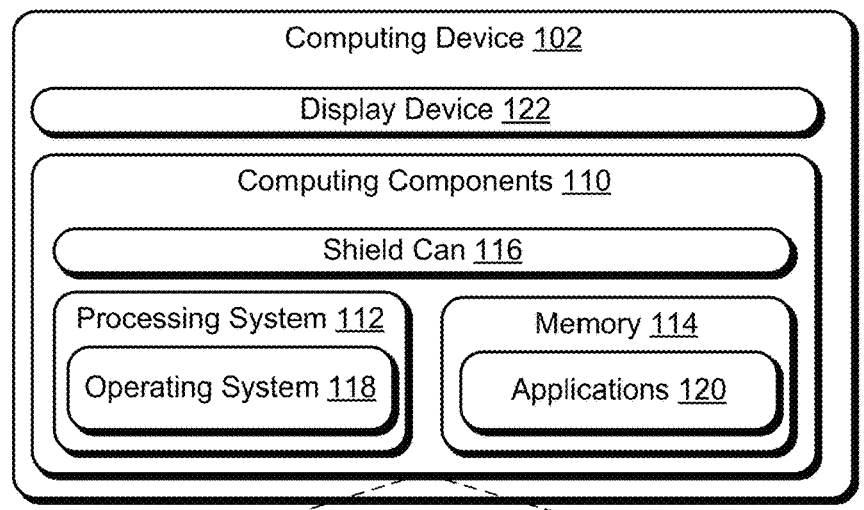
FIG. 1 is an illustration of an environment in an example implementation that is operable to employ a device utilizing the shield can techniques described herein.
Figure 1:
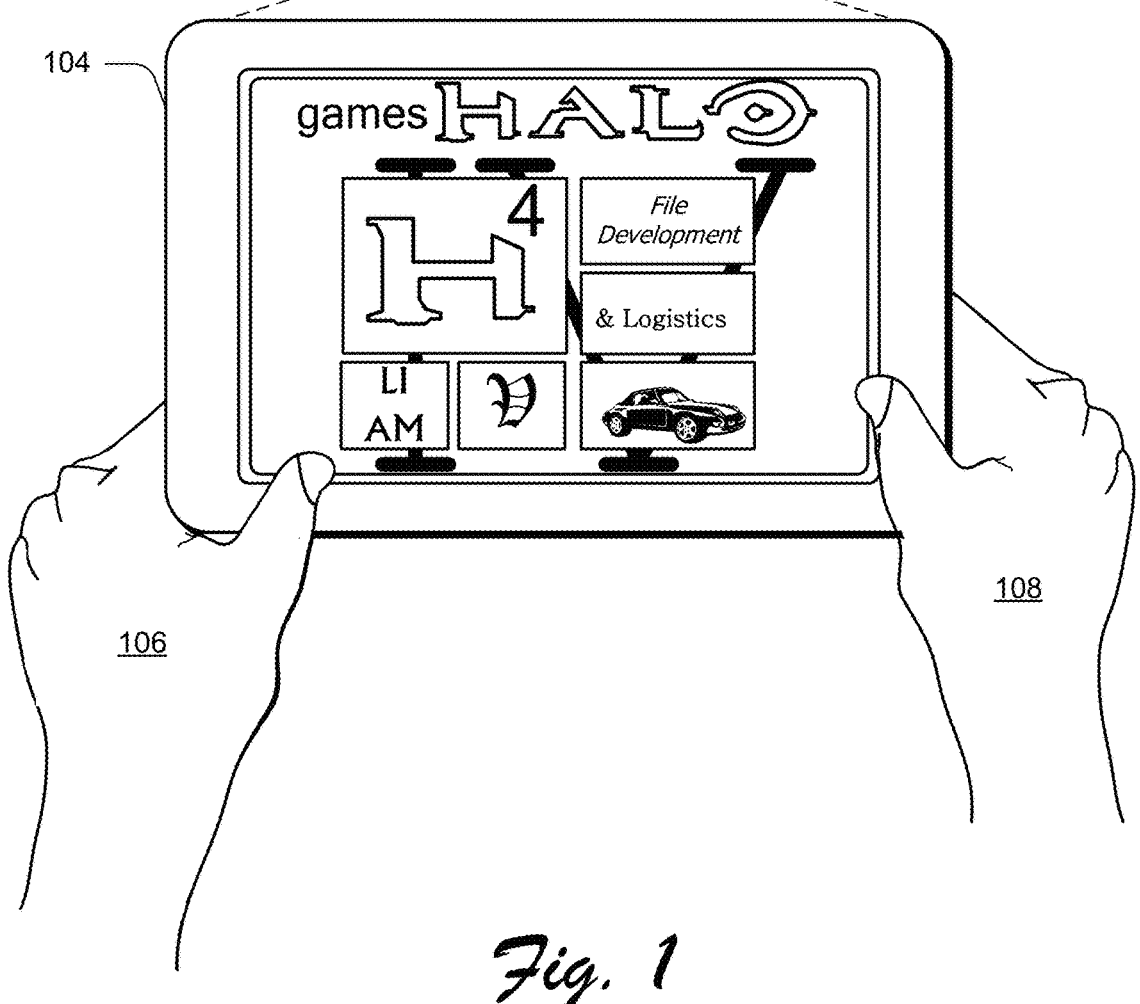

FIG. 1 is an illustration of an environment 100 in an example implementation that is operable to employ techniques described herein. The illustrated environment 100 includes a computing device 102. The computing device 102 may be configured in a variety of ways. For example, the computing device 102 may include a housing 104 that is configured for mobile use (e.g., handheld), such as in a slate configuration. Examples of slate configurations may be found in mobile phones, a tablet computer as illustrated, portable game devices, music players, and so on. The housing 104 may be formed in a variety of ways, such as through injection of a metal alloy such as a magnesium alloy. Thus, the computing device 102 may range from full resource devices with substantial memory and processor resources to a low-resource device with limited memory and/or processing resources.

In this example, the computing device 102 is illustrated as being grasped in the hands 106, 108 of a user. Thus, as illustrated, the thumbs of the user's hands 106, 108 are positioned to interact with a front surface of the input device and computing device 102 that includes one or more computing components 110 which may be configured to perform and/or assist in performance of one or more operations of the computing device 102, e.g., in execution of instructions specified by software. Examples of computing components 110 include a processing system 112, memory 114, and shield can 116 with examples of software that include an operating system 118 and applications 120.

The computing device 102 may be configured in a variety of ways. For example, a computing device may be configured as a computer that is capable of communicating over a network, such as a desktop computer, a mobile station, an entertainment appliance, a set-top box communicatively coupled to a display device, a wireless phone, a game console, educational interactive devices, point of sales devices, and so forth. Thus, the computing device 102 may range from full resource devices with substantial memory and processor resources (e.g., personal computers, game consoles) to a low-resource device with limited memory and/or processing resources (e.g., traditional set-top boxes, hand-held game consoles). Additionally, although a single computing device 102 is shown, the computing device 102 may be representative of a plurality of different devices, such as multiple servers utilized by a business to perform operations such as by a web service, a remote control and set-top box combination, an image capture device and a game console configured to capture gestures, and so on. In addition, it may apply to apparatuses including a plurality of display devices, e.g., a clam shell configuration.

The computing device 102 may support a variety of different interactions. For example, the computing device 102 may include one or more hardware devices that are configured to be manipulated by a user to interact with the device, such as a keyboard, cursor control device (e.g., mouse), and so on. The computing device 102 may also support gestures, which may be detected in a variety of ways. The computing device 102, for instance, may support touch gestures that are detected using touchscreen functionality of the computing device 102.

The shield can 116 is representative of a shield can assembly that may be configured to provide electromagnetic shielding of electronic components, such as a flexible printed circuit (FPC). For instance, electronic components may emit an electromagnetic field, such as radio frequency (RF) electromagnetic radiation, radio waves, and/or electrostatic fields. These emissions can interfere with the performance of sensitive wireless receivers. The shield can 116 may be configured to reduce electromagnetic interference (EMI) caused by the electronic components by providing an enclosure made of conductive and/or magnetic materials. In this way, the shield can 116 may block the electromagnetic field produced by a particular electronic component from leaving the enclosure, and also block other electromagnetic fields from entering the enclosure.

A display device 122 integrated with the computing device 102 may include touchscreen functionality that is configured to detect proximity of an object (e.g., one or more fingers of the user's hands 106, 108) to interact with a user interface displayed by the display device 122. Further discussion of functionality of the computing device may be found below in a corresponding section.

Example Device

Figure 2:
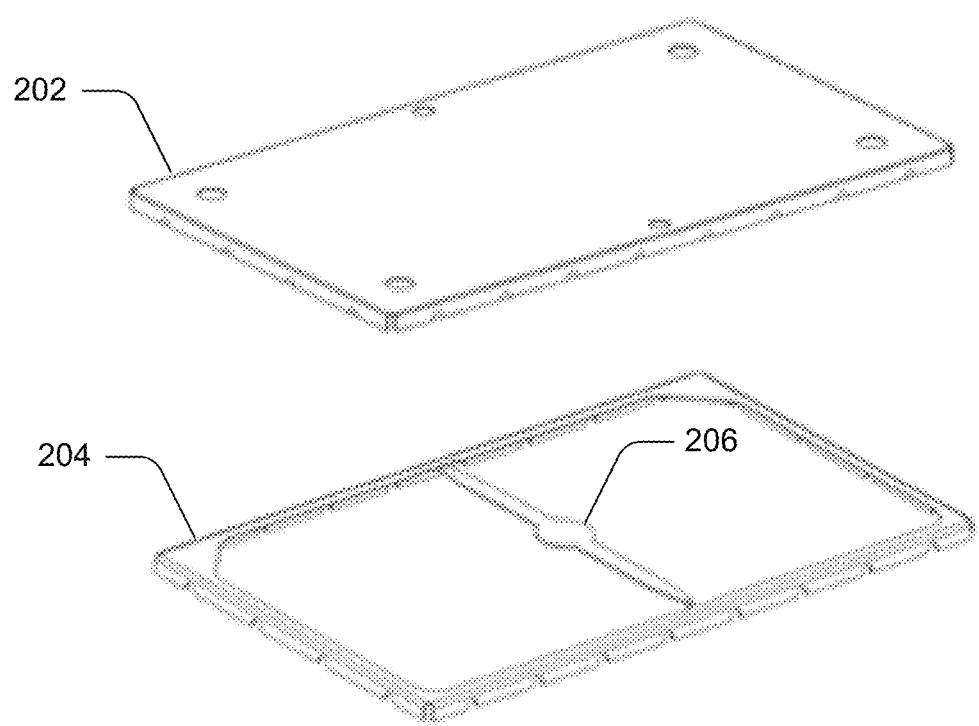
FIG. 2 depicts an isometric view of an example two-part shield can assembly.

FIG. 2 depicts an isometric view of an example two-part shield can assembly 200. This shield can assembly 200 illustrates a lid 202 that is configured to connect to a frame 204 to provide an enclosure. The frame 204 may be formed from any of a variety of materials. For example, the frame 204 may be formed from sheet metal, or any other conductive and/or magnetic material. In addition, the frame 204 may be configured to be soldered to a PCB. In an embodiment, the frame 204 may include a cross-bar 206 that enables flatness tolerances of ±0.05 millimeters for the overall flatness of the frame 204 and also provides a means for a Pick and Place machine suction tip to pick the part for placement on the PCB.

Figure 3:
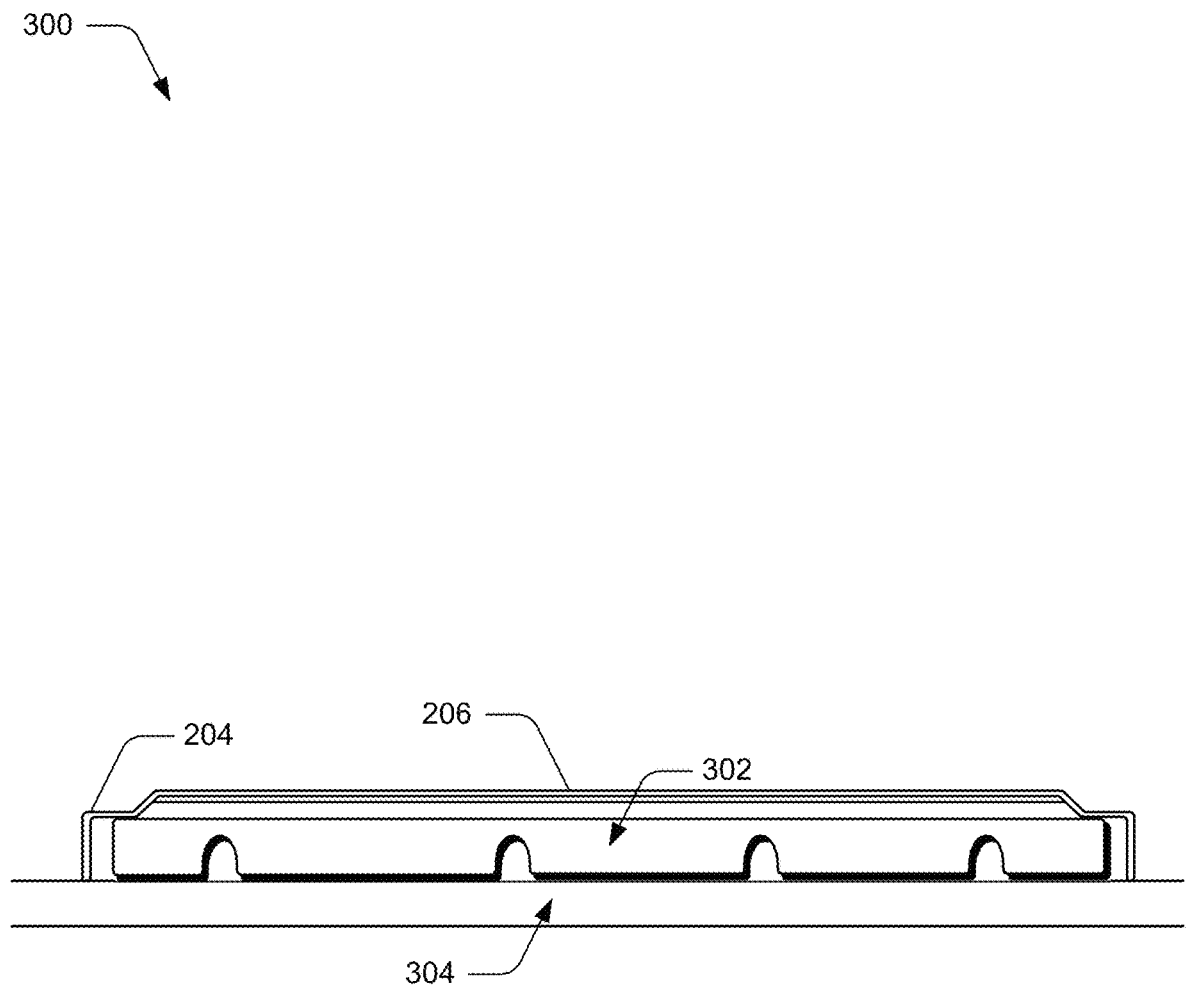
FIG. 3 depicts a cross-sectional view of the frame showing a cross-bar shape.

FIG. 3 depicts a cross-sectional view, generally at 300, of the frame showing the cross-bar shape. In an embodiment, the cross-bar 206 may be bent up to be raised above a flange of the frame 204 in order to avoid interference with the components 302 to be shielded. For example, if the component height were 1.2 mm and the frame height were 1.35 mm, with a thickness of the cross-bar 206 of 0.15 mm, then the lower surface of the cross-bar 206 (e.g., the side facing the PCB 304) would interfere with the component 302 and result in an unusable component 302 or frame 204.

The frame 204 and components 302 may be soldered to the PCB 304, such as via SMT solder reflow. The PCB 304 may be configured to mechanically support and electrically connect the electronic components using conductive tracks, pads, and other features etched from a conductive material, such as copper sheets, laminated onto a non-conductive substrate. In some embodiments, the PCB 304 may include one or more components embedded in the substrate, such as capacitors, resistors, and/or active devices.

Figure 4:
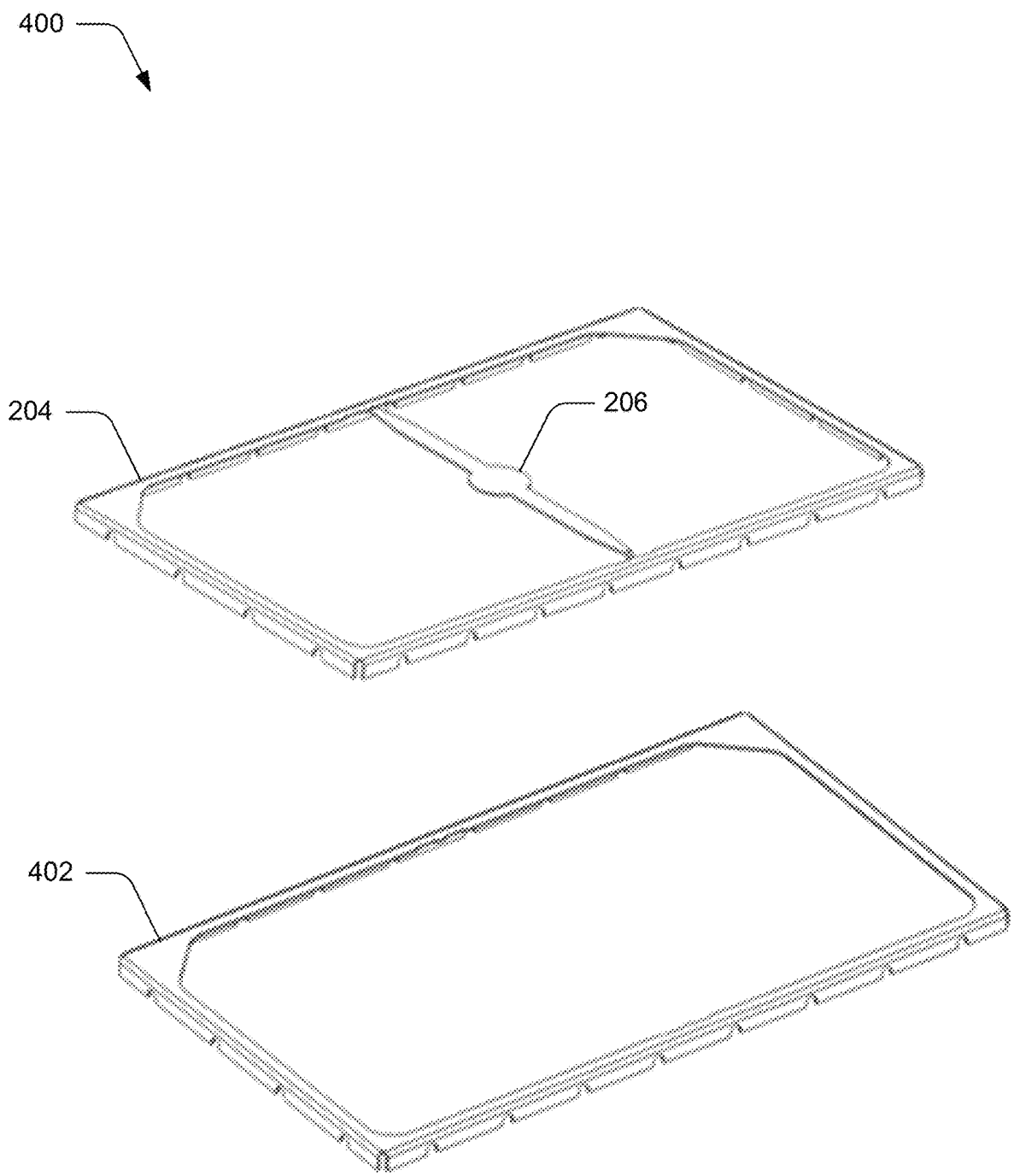
FIG. 4 depicts an isometric view of an example frame of the shield can assembly in FIG. 2 with a cross-bar and without the cross-bar.

Once the frame 204 is secured to the PCB 304, the cross-bar 206 may be removed from the frame 204. In at least some embodiments, the cross-bar 206 may be removed via twisting or snipping. For example, FIG. 4 depicts an isometric view, generally at 400, of an example frame of the shield can assembly with a cross-bar and without the cross-bar. In the upper drawing, the frame 204 is illustrated as having the cross-bar 206 attached. Once the cross-bar 206 is removed, the frame 204 becomes frame 402, as illustrated in the lower drawing.

After the cross-bar is removed, other components may be inserted within the frame and installed on the PCB. For example, an FPC may be soldered onto the PCB. In some embodiments, the FPC may be installed prior to installation of the frame. Once all the desired components are installed within the frame 204 and the cross-bar 206 is removed, then the lid 202 from FIG. 2 may be placed over top of the frame 402 to create the shield can assembly.

Figure 5:
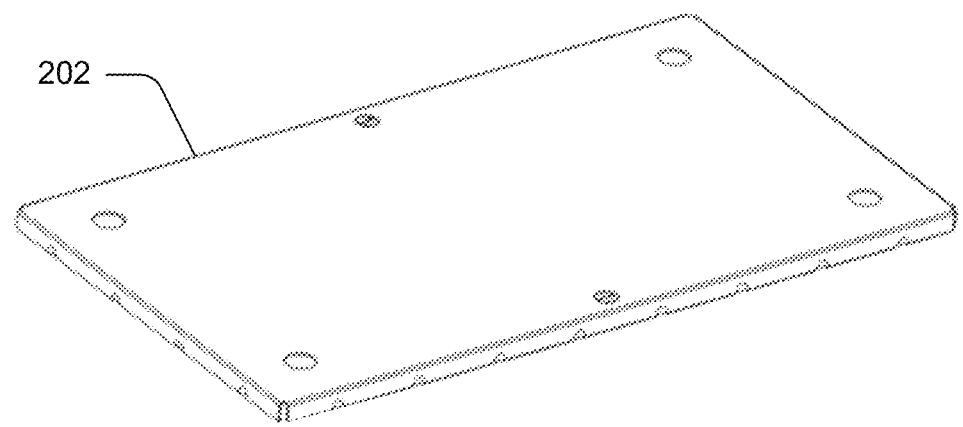
FIG. 5 depicts an isometric view of a shield can as installed on a printed circuit board.

FIG. 5 depicts an isometric view, generally at 500, of a shield can as installed on a PCB. The lid 202 may include holes to ensure that any burr left behind by the cross-bar does not prevent the lid from fully seating. In at least one embodiment, the lid 202 includes two holes, one for each connection point of the cross-bar 206 to the frame 204. In an embodiment, the lid may include additional holes, such as the four holes illustrated in FIG. 5, for fabrication purposes. In order to adequately shield an electromagnetic field, the holes in the lid 202 may be smaller than the smallest amplitude or highest frequency wave that is being shielded. Additionally, with mobile computing device designs becoming ever thinner, the shield can assembly may have a low profile. For example, the shielding can assembly can have a total height between the range of approximately 0.8 mm to 1.5 mm, with shielded components that are less than 1.2 mm tall.

Figure 6A:
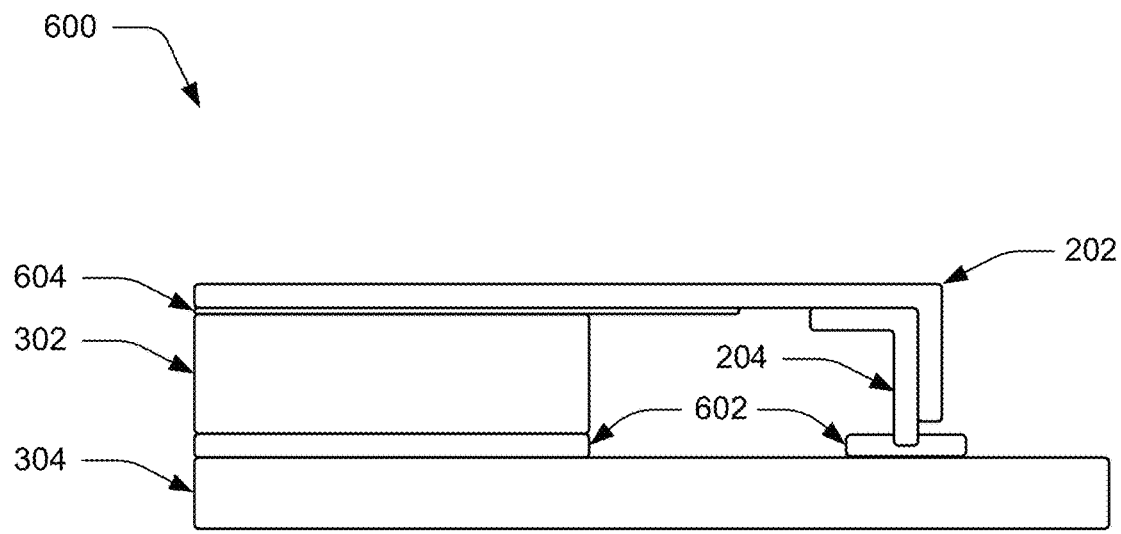
FIG. 6a depicts a cross-sectional view of a shield can assembly showing relative positions of a shielded component and the shield can assembly.

Consider now FIG. 6a, which depicts a cross-sectional view of an example system 600 that includes a shield can assembly showing relative positions of a shielded component and the shield can assembly. For example, at the base of the assembly is the PCB 304. In some embodiments, an adhesive 602, such as solder paste, is attached to a surface of the PCB 304. Using the adhesive 602, a component 302 and the frame 204 are installed onto the PCB 304. As previously described, the component 302 may be placed first onto the PCB 304 followed by installation of the frame 402, or the frame 402 may be placed first onto the PCB 304 followed by installation of the component 302. In addition, an adhesive 604, such as pressure sensitive adhesive (PSA), can be adhered to the upper surface of the component (e.g., away from the PCB 304) and adhered to the bottom surface of the lid 202 when the lid 202 is installed.

Figure 6B:
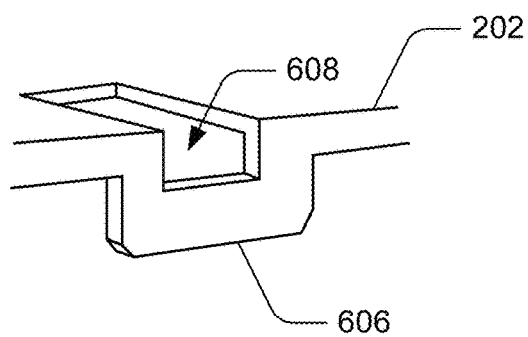
FIG. 6b depicts an illustration of an example connecting component of the lid from FIG. 6a in greater detail.
Figure 6C:
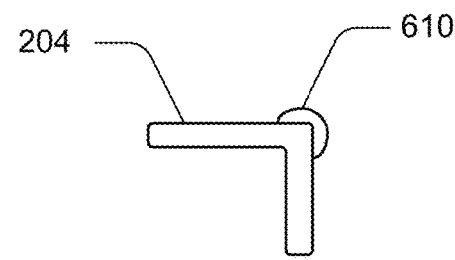
FIG. 6c depicts an illustration of an example connecting component of the frame from FIG. 6a in greater detail.

In one or more embodiments, the lid 202 may be adhered to the frame 204 using a PSA. Alternatively or in addition, the lid 202 may latch to the frame 204 using a mechanical latch, such as a "bump and lip" configuration. For example, consider FIGS. 6b and 6c. FIG. 6b depicts an illustration of an example connecting component of the lid from FIG. 6a in greater detail. In an embodiment, the connecting component of the lid 202 may include a lip 606 and an indentation or hole 608 that is configured to receive a bump or protrusion disposed on a connecting component of the frame 204. An example connecting component of the frame 204 is illustrated in FIG. 6c. In at least one embodiment, the frame 204 may include a protrusion 610 or "bump" disposed on an edge of the frame 204 such that the protrusion 610 is configured to extend outward from the edge of the frame 204 on a side of the frame 204, or on top of the frame 204, or both.

When the lid 202 is placed onto the frame 204, the lip 606 engages the protrusion 610. With sufficient force, the lip 606 of the lid 202 can be pushed passed the protrusion 610 on the frame until the protrusion 610 engages the indentation or hole 608. It should be readily apparent to a person of ordinary skill in the art that this design may be reversed (e.g., the indentation or hold may be arranged on the frame and the protrusion may be arranged on the lid), combined, and so on.

Figure 7:
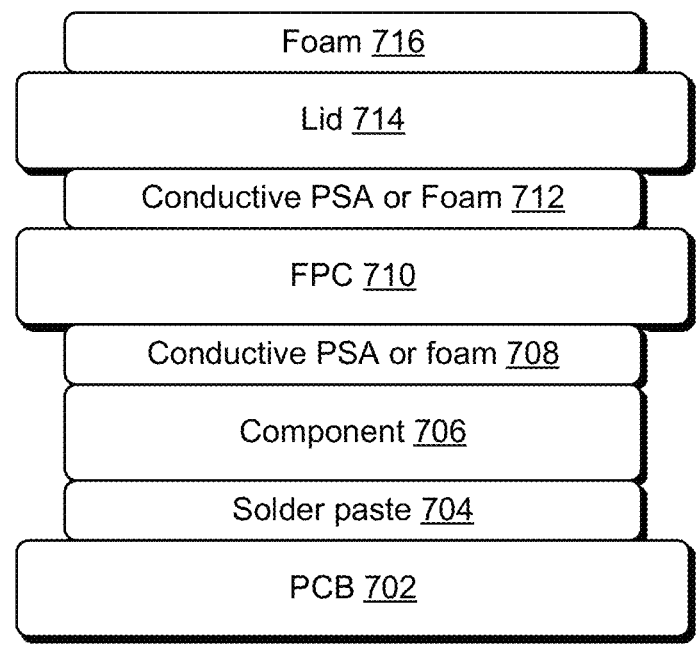
FIG. 7 depicts an example shield can assembly showing relative positions of a shielded component and the shield can assembly.

Consider now FIG. 7, which depicts an example shield can assembly, generally at 700, showing relative positions of a shielded component and the shield can assembly. A variety of configurations of positions of the various components can be used to construct the shield can. The examples described herein are not exhaustive and the configurations of relative positioning of the components is not limited to the description herein. Any combination of the different layers described in FIG. 7 can be used.

In the example shown in FIG. 7, a PCB 702 may include solder pads upon which solder paste 704 may be applied. One or more components 706 may be placed onto the solder paste 704, such as by a Pick and Place machine or other SMT technology. Then, conductive PSA or conductive foam 708 is adhered to the top surface of the components 706 and the bottom surface of the FPC 710. Alternatively, the FPC 710 may be placed directly onto the solder paste 704 without the component 706 being installed. Once the FPC 710 is placed onto the PSA or foam 708, additional conductive PSA or conductive foam 712 may be adhered to the top surface of the FPC 710. At least a portion of the lid 714, such as a flange of the lid 714, may be placed onto the additional conductive PSA or conductive foam 712. In some embodiments, further additional conductive foam 716 may be placed on the top surface of the lid 714. It should be readily apparent that various combinations of the above-described layers are contemplated.

For instance, in one embodiment, conductive foam can be adhered to both the top and bottom surfaces of a flange of the lid 714, with conductive PSA adhering the FPC 710 to a shield fence flange, such as a flange of the frame. In an alternative embodiment, conductive PSA may adhere the flange of the lid 714 to the FPC, and conductive foam may be adhered to the bottom surface of the FPC 710 and to the solder paste 704. In another embodiment, conductive PSA may adhere the flange of the lid 714 to the FPC, and additional PSA may adhere the FPC to the shield fence flange. A shield can may also be configured to permit an FPC 710 to exit the shield can through a gap in the shield can frame. The portion of FPC 710 that is outside of the shield can frame may also be enclosed by conductive foam or other conductive material to maintain RF shielding in a very narrow space. In this manner, an FPC may be entirely enclosed by a conductive material such that signals carried on the FPC may not cause electromagnetic interference (EMI) to interfere with other signals or circuits. The conductive material surrounding the FPC may also prevent EMI generated by other signals or circuits from interfering with the signals carried by the FPC.

Figure 8:
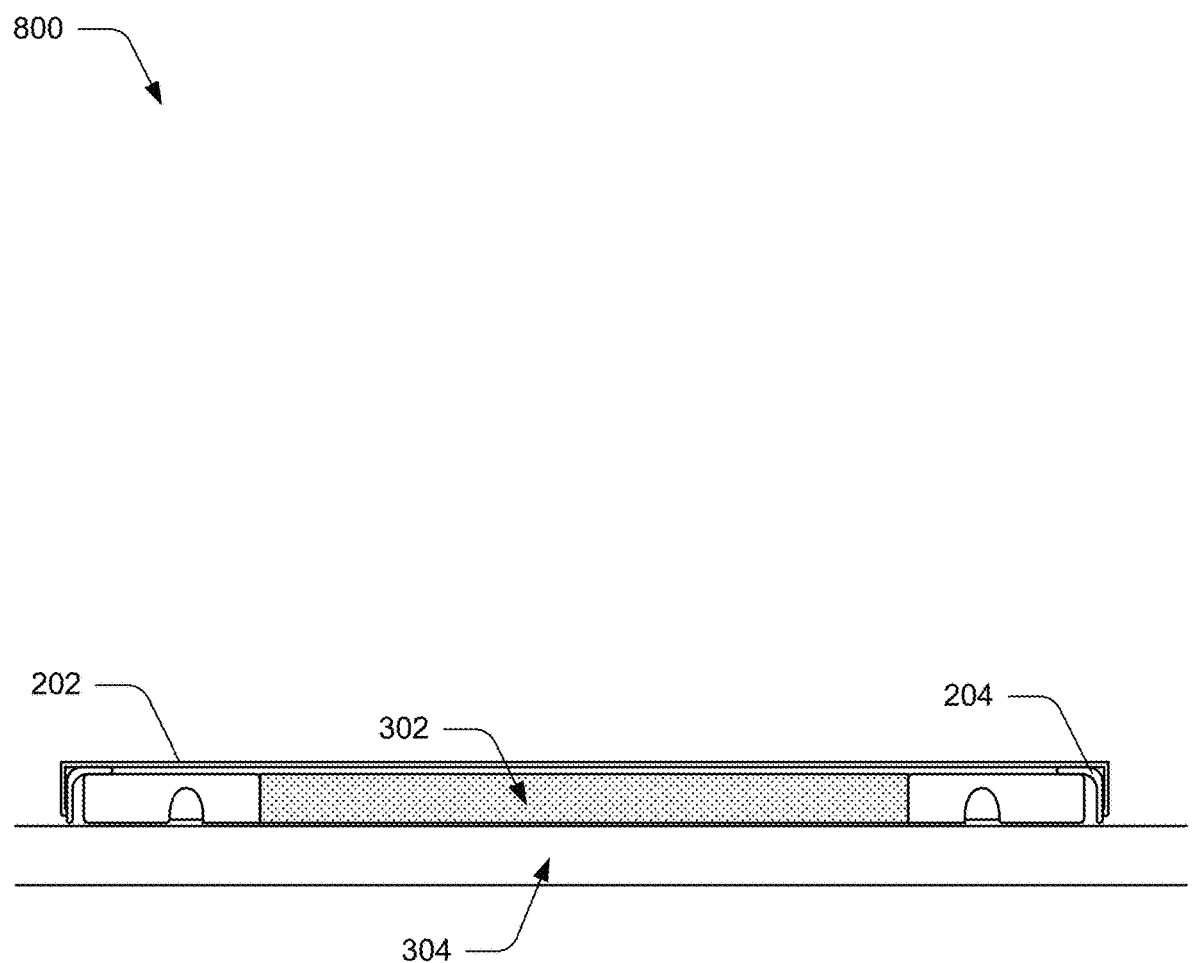
FIG. 8 depicts a cross-sectional view of the shield can assembly and shielded component.

FIG. 8 depicts a cross-sectional view, generally at 800, of the shield can assembly and shielded component. In this example, the lid 202 is disposed over the component 302 to be shielded. In addition, the lid 202 is secured to the frame 204. Thus, the lid 202 provides an enclosure configured to block electromagnetic fields, such as RF fields, from entering or leaving the enclosure.

Figure 9:
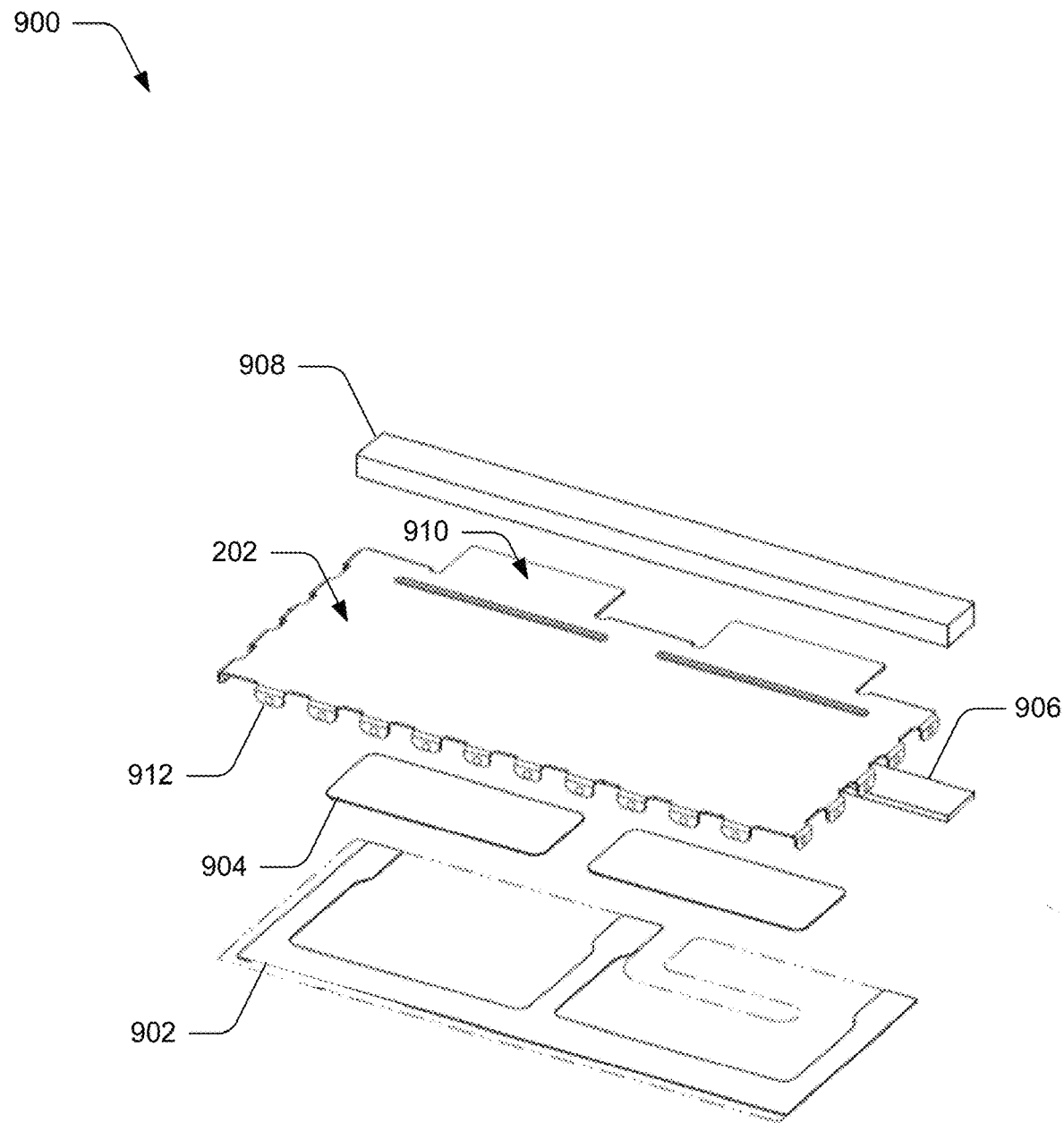
FIG. 9 depicts an illustration of an isometric view of an example shield can assembly.

FIG. 9 depicts an illustration of an isometric view of an example shield can assembly 900. In this example, the shield can assembly 900 includes an adhesive 902, an insulator 904, conductive foam 906, 908 and a lid 202. The lid may include multiple dimples disposed along a perimeter of the lid to create an EMI shield. The adhesive 902 is configured to adhere the lid 202 to the frame. As illustrated in FIG. 9, the adhesive 902 may be formed to adhere to the bottom surface of the lid 202 along one or more edges of the lid 202. Although a rectangular shape is illustrated for the lid 202, any suitable shape may be used. In addition, the lid 202 may include one or more flanges 910 that are configured to interface with the conductive foam 906, 908. The flanges 910 may also be usable in removing the lid 202 after installation to allow for rework and/or process/manufacturing troubleshooting.

Figure 10:
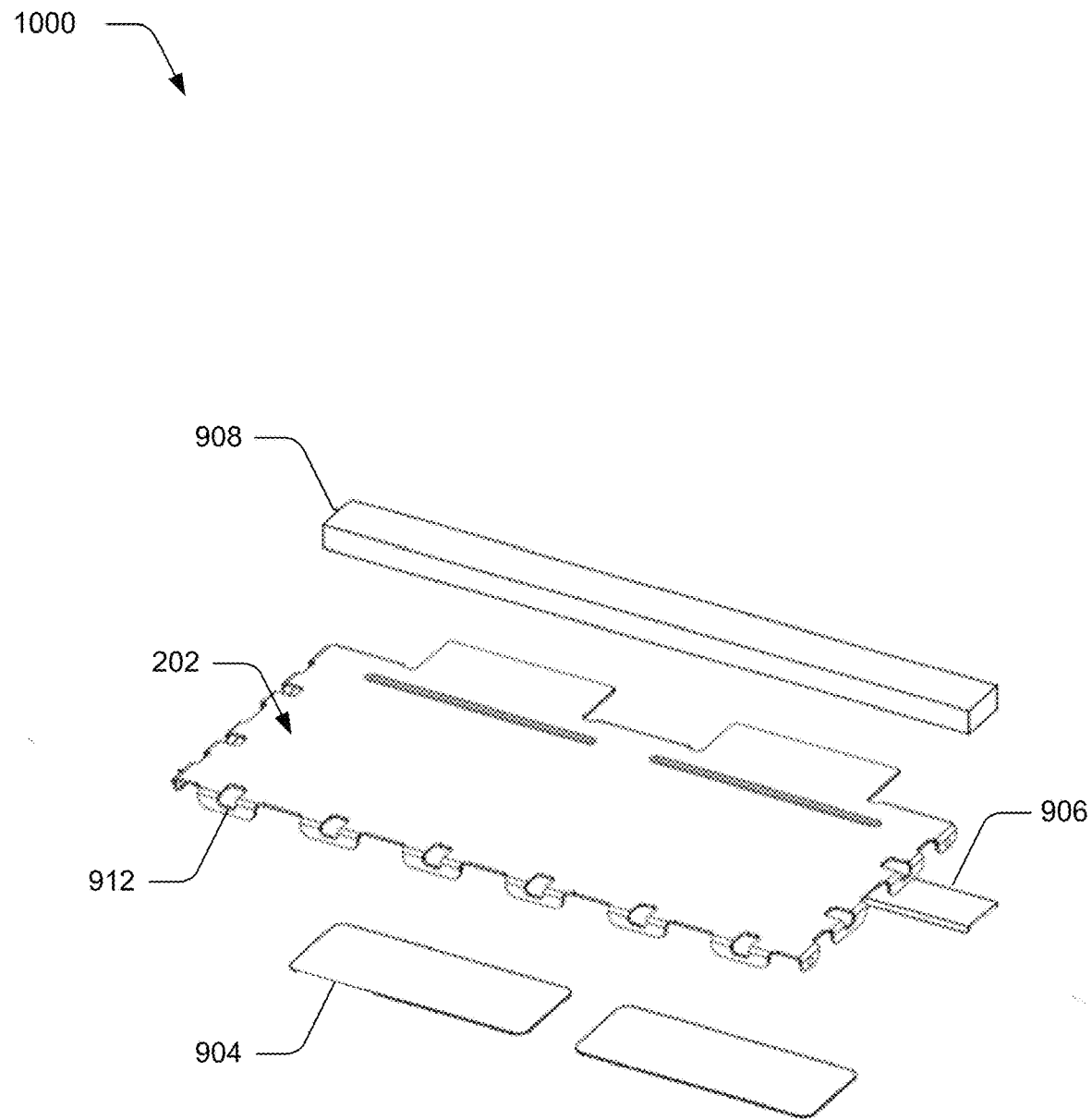
FIG. 10 depicts an illustration of an isometric view of an example shield can assembly.

FIG. 10 depicts an illustration of an isometric view of an additional example shield can assembly 1000. In this example, the shield can assembly 1000 includes an insulator 904, conductive foam 906, 908, and a lid 202. The lid 202 may include one or more lips 912 with holes that are configured to engage protrusions disposed on the frame, to create a mechanical latch to secure the lid 202 to the frame. The lips 912 may include flanges bent downward to interface with one or more edges of the frame. Alternatively, the lips 912 may each include a protrusion configured to engage an indentation or hole disposed on the frame to create a mechanical latch to secure the lid 202 to the frame. Further still, a combination of the protrusions and holes may be included on the lid 202 and frame.

Example Procedures

The following discussion describes shield can techniques that may be implemented utilizing the previously described systems and devices. Aspects of each of the procedures may be implemented in hardware, firmware, or software, or a combination thereof. The procedures are shown as a set of blocks that specify operations performed by one or more devices and are not necessarily limited to the orders shown for performing the operations by the respective blocks. In portions of the following discussion, reference will be made to the environment 100 of FIG. 1, and various elements of FIGS. 2-10.

Figure 11:
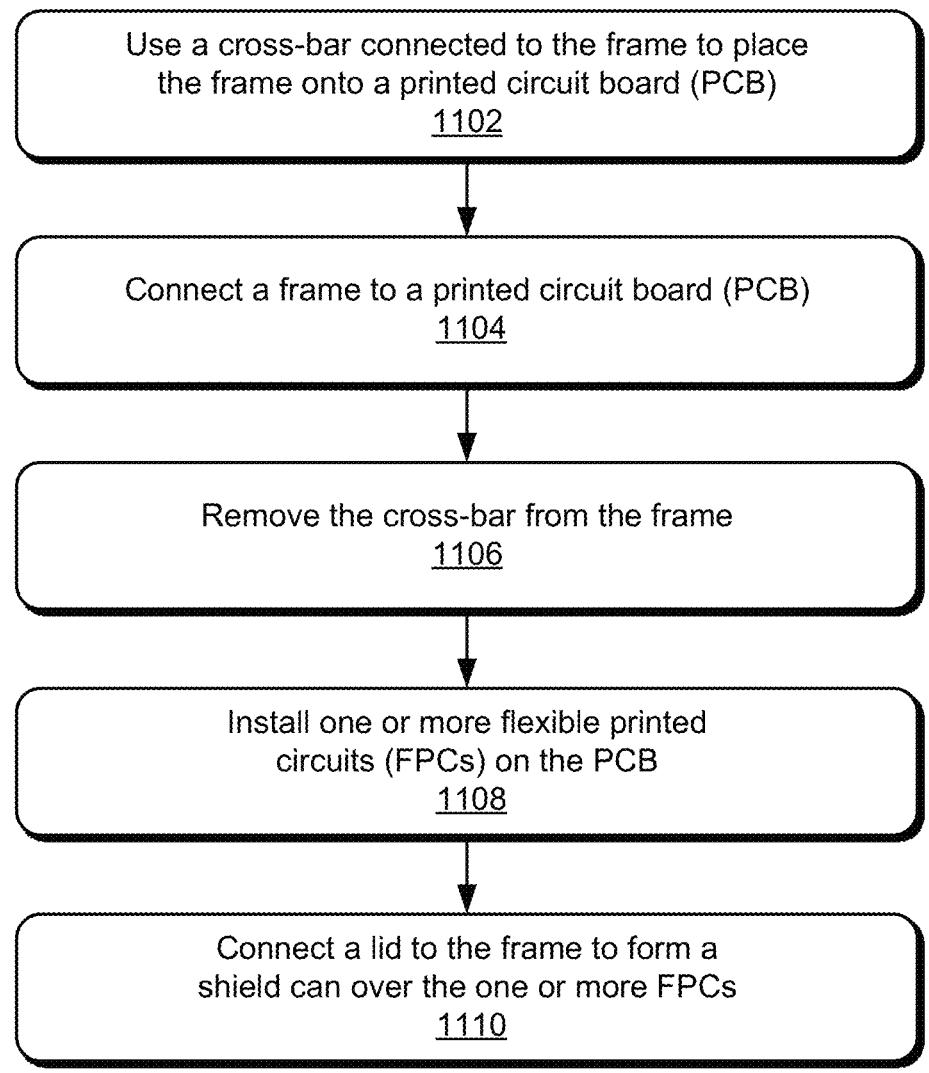
FIG. 11 depicts a flow diagram of an example shield can assembly process.

FIG. 11 depicts a flow diagram of an example assembly of a shield can. A cross-bar connected to a frame is used to place the frame onto a PCB (block 1102). For example, the cross-bar may be used by a Pick and Place machine suction tip to pick the part (e.g., frame) for placement on the PCB. The frame is connected to the PCB (block 1104). This step can be performed in any suitable way. For example, the frame may be soldered to the PCB, such via an SMT process.

Once the frame is connected to the PCB, the cross-bar is removed from the frame (block 1106). For example, the cross-bar may be removed by twisting or snipping. Other techniques to remove the cross-bar from the frame are also contemplated. Once the cross-bar is removed, one or more flexible printed circuits (FPCs) may be installed on the PCB (block 1108).

Subsequent to the installation of the frame and the components, a lid may be connected to the frame to form an enclosure over the components (block 1110). For example, the lid may be configured to block electromagnetic fields generated by the component or by another nearby component, such that the lid blocks electromagnetic fields from entering and/or leaving the enclosure. As described above, the lid may be connected and secured to the frame via adhesive, such as conductive PSA, and/or via a mechanical latch, such as with a "bump and lip" configuration.

Example Device

Figure 12:
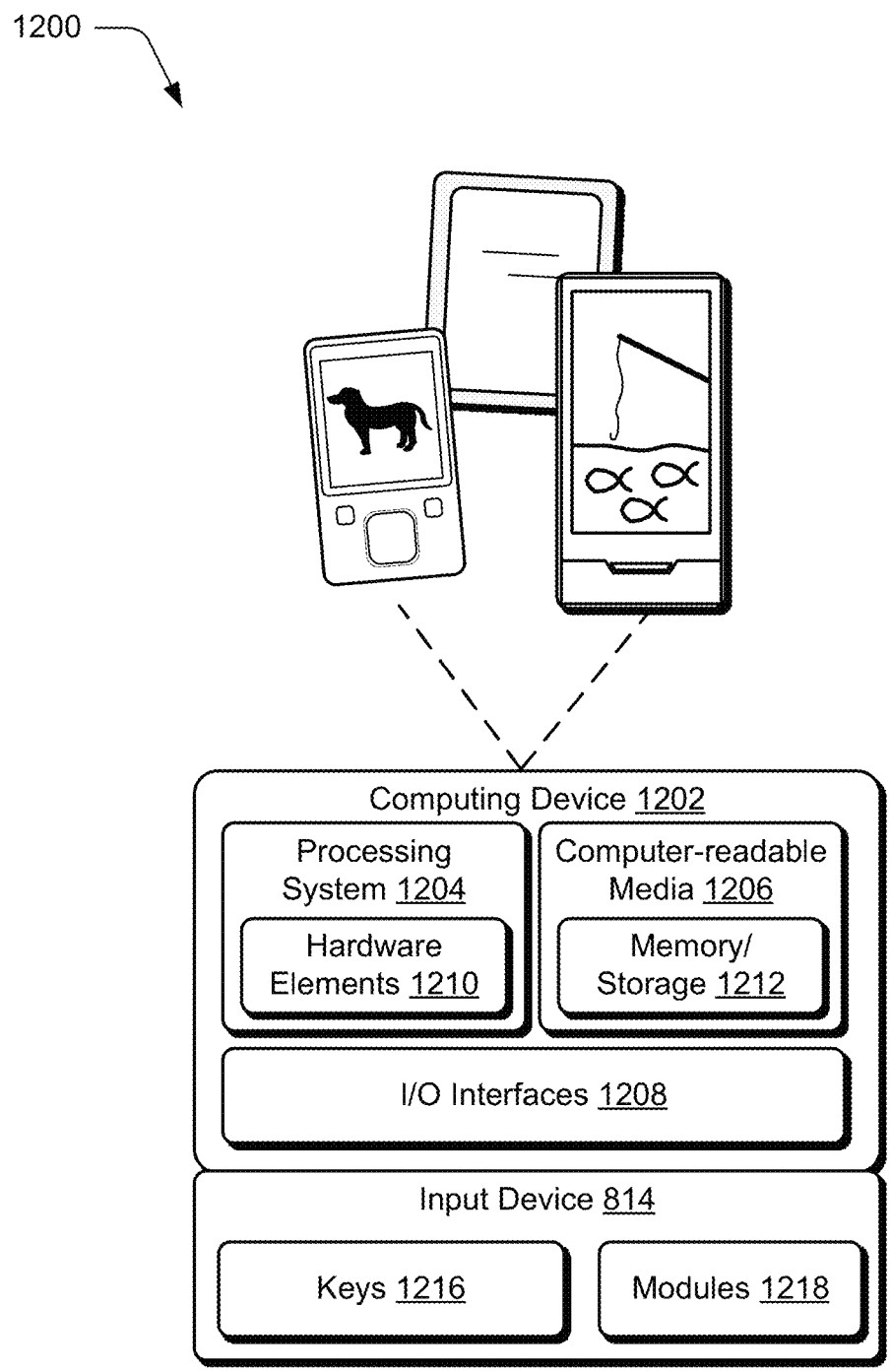
FIG. 12 depicts an example system that includes an example computing device that may implement and/or include the various shield can assembly techniques.

FIG. 12 illustrates an example system generally at 1200 that includes an example computing device 1202 that is representative of one or more computing systems and/or devices that may implement the various techniques described herein. The computing device 1202 may be, for example, be configured to assume a hand held configuration through use of a housing formed and size to be grasped and carried by one or more hands of a user, illustrated examples of which include a mobile phone, mobile game and media device, and tablet computer although other examples are also contemplated.

The example computing device 1202 as illustrated includes a processing system 1204, one or more computer-readable media 1206 (e.g., non-transitory forms of media that do not include signals per se), and one or more I/O interface 1208 that are communicatively coupled, one to another. Although not shown, the computing device 1202 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1204 is representative of functionality to perform one or more operations using hardware. Accordingly, the processing system 1204 is illustrated as including hardware element 1210 that may be configured as processors, functional blocks, and so forth. This may include implementation in hardware as an application specific integrated circuit or other logic device formed using one or more semiconductors. The hardware elements 1210 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1206 is illustrated as including memory/storage 1212. The memory/storage 1212 represents memory/storage capacity associated with one or more computer-readable media. The memory/storage component 1212 may include volatile media (such as random access memory (RAM)) and/or nonvolatile media (such as read only memory (ROM), Flash memory, optical disks, magnetic disks, and so forth). The memory/storage component 1212 may include fixed media (e.g., RAM, ROM, a fixed hard drive, and so on) as well as removable media (e.g., Flash memory, a removable hard drive, an optical disc, and so forth). The computer-readable media 1206 may be configured in a variety of other ways as further described below.

Input/output interface(s) 1208 are representative of functionality to allow a user to enter commands and information to computing device 1202, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1202 may be configured in a variety of ways to support user interaction.

The computing device 1202 is further illustrated as being communicatively and physically coupled to an input device 1214 that is physically and communicatively removable from the computing device 1202. In this way, a variety of different input devices may be coupled to the computing device 1202 having a wide variety of configurations to support a wide variety of functionality. In this example, the input device 1214 includes one or more keys 1216, which may be configured as pressure sensitive keys, mechanically switched keys, and so forth.

The input device 1214 is further illustrated as include one or more modules 1218 that may be configured to support a variety of functionality. The one or more modules 1218, for instance, may be configured to process analog and/or digital signals received from the keys 1216 to determine whether a keystroke was intended, determine whether an input is indicative of resting pressure, support authentication of the input device 1214 for operation with the computing device 1202, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1202. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1202, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1210 and computer-readable media 1206 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1210. The computing device 1202 may be configured to implement particular instructions and/or functions corresponding to the software and/or hardware modules. Accordingly, implementation of a module that is executable by the computing device 1202 as software may be achieved at least partially in hardware, e.g., through use of computer-readable storage media and/or hardware elements 1210 of the processing system 1204. The instructions and/or functions may be executable/operable by one or more articles of manufacture (for example, one or more computing devices 1202 and/or processing systems 1204) to implement techniques, modules, and examples described herein.

Clip Shield

In order to electromagnetically shield certain large areas of a PCB using conventional sheet-metal shielding, the shield cans are limited to a certain size in order to allow for standard high-production PCB assembly (SMT process). This is due to the lack of flatness inherent in PCBs over areas generally larger than 50 by 50 mm Above this area [and aspect ratio], the flatness is such that the height of the solder paste may be less than the flatness of the PCB, resulting in segment(s) of the shielding can that would not be electrically connected to the PCB.

By using discreet clips, which are directly soldered to the PCB via standard high-production pick and place machine and SMT process, and by pressing a single large shielding can into said clips, a continuous electrical connection can be achieved around the perimeter of the area intended to be shielded. Furthermore, when using a larger shielding can, the number of clips involved in creating an electrically continuous perimeter scales with the length of the perimeter and the force required to press the shielding can into the clips [and thus attach the can to the PCB] also becomes large.

Figure 13:
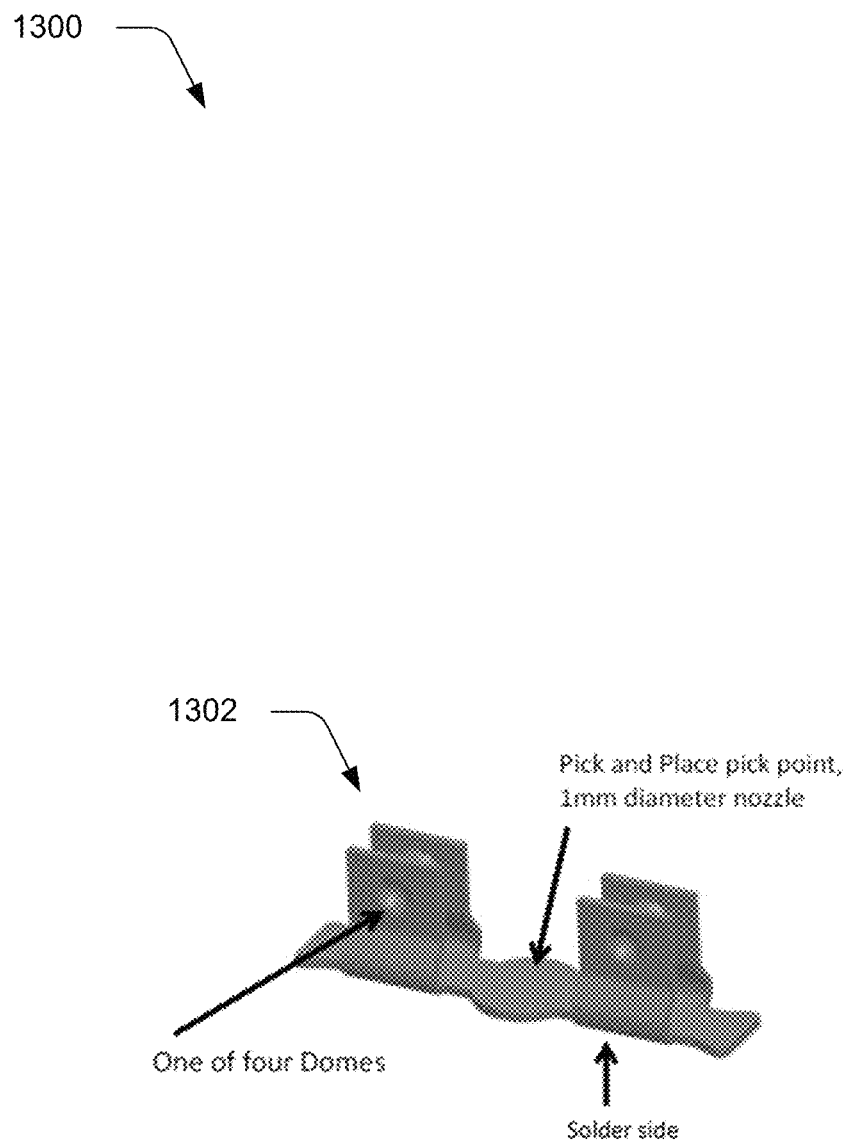
FIG. 13 depicts an illustrations of an isometric view of an example shield clip.

FIG. 13 depicts an illustration of an isometric view 1300 of an example shield clip. The shield clip 1302 includes a solder side that can be soldered to directly to the PCB or to an optional riser plate. Additionally, the shield clip 1302 can include one or more domes, which are discussed in further detail below. The shield clip 1302 also includes a Pick and Place pick point to enable a pick and place machine to grasp the shield clip 1302.

Figure 14:
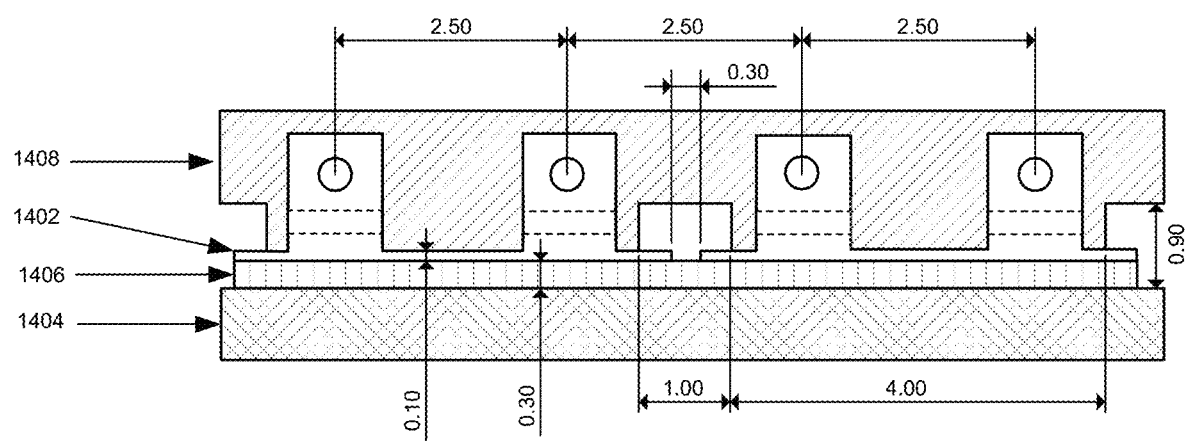
FIG. 14 depicts an illustration of a side view of an example assembly of two clips installed onto a PCB with optional riser plates.

FIG. 14 depicts an illustration of a side view of an example shield clip assembly 1400. The shield clip assembly 1400 includes two clips 1402 installed onto a PCB 1404 with an optional riser piece 1406. This view shows a maximum recommended gap between electrical contact points of 2.5 mm in order to effectively shield electromagnetic waves with an amplitude of 2.5 mm or greater. FIG. 14 includes various dimensions that may be used for each component of the assembly. However, the dimensions shown are merely examples and the shield clip assembly is not limited to the example dimensions shown.

The clip design reduces this force in order to avoid damaging the can 1408 during installation. Additionally, the clip 1402 can be manufactured with a riser piece 1406 attached to the solder side of the clip which acts to raise the clip 1402 off of the PCB 1404 surface in the event that this is desirable, such as in the case where under fill glue/epoxy will be used in the vicinity of the shield can perimeter, and a traditional surface-mount clip would have its base covered with the flow of glue/epoxy such that the shielding can 1408 would not be able to fully seat into the clip 1402, leading to possible interferences with other internal Device components.

Figure 15:
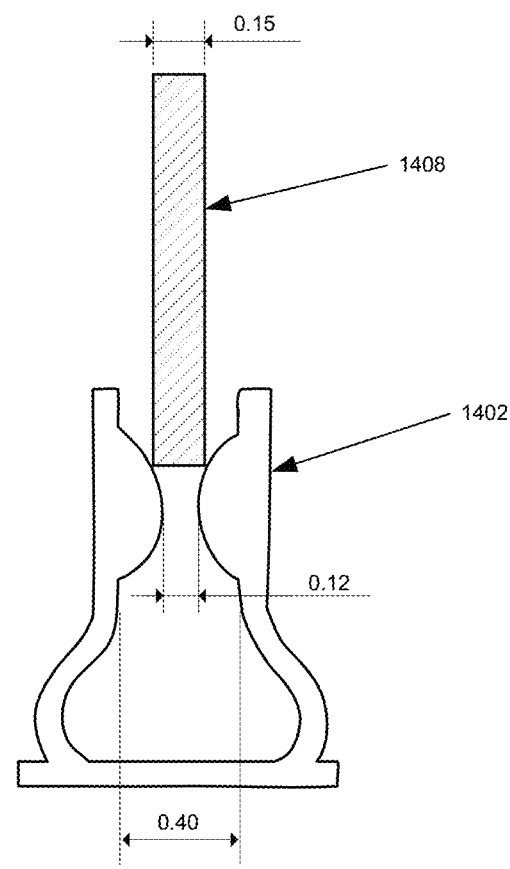
FIG. 15 depicts an illustration of a side view of an example shield clip with a representative shield can sidewall.

FIG. 15 depicts a side view of an example shield clip with a representative shield can sidewall, showing how the interference and frictional attachment can be achieved when manually joining the shield can to the clip (and to the PCB). The dimensions shown in FIG. 15 are negotiable depending on the specific design requirements.

The clip design enables a reduction in shield can 1408 insertion force. An embodiment of the design protects the function of the clip 1402 against underfill glue/epoxy that is commonly used to hold down larger PCB components, such as the CPU or PCH.

The low-insertion force clip differs from a traditional clip in two ways: a raised dome protrudes out from the clip surface to change the friction contact from a line to a point; and the locations of the domes on the clip 1402 are such that the effective gap between domes when placed on the PCB is 2.5 mm or less. This may be used to reduce emissions from such components as a CPU or PCH processor chip, where shielding for Wifi or telecommunications. An optional riser plate can be laser welded to the clip 1402 to protect against contamination from epoxy or glue dispensed onto the PCB as part of the manufacturing process.

The clip may be made using a sheet metal forming processes. The metal has a solderable plating and an area large enough for suction placement which allows it to be placed on the PCB using a pick and place machine and it is compatible with the industry standard SMT process. The optional riser plate is also a plated [or otherwise solderable] metal which is laser welded [or otherwise affixed] to the clip.

Figure 16:
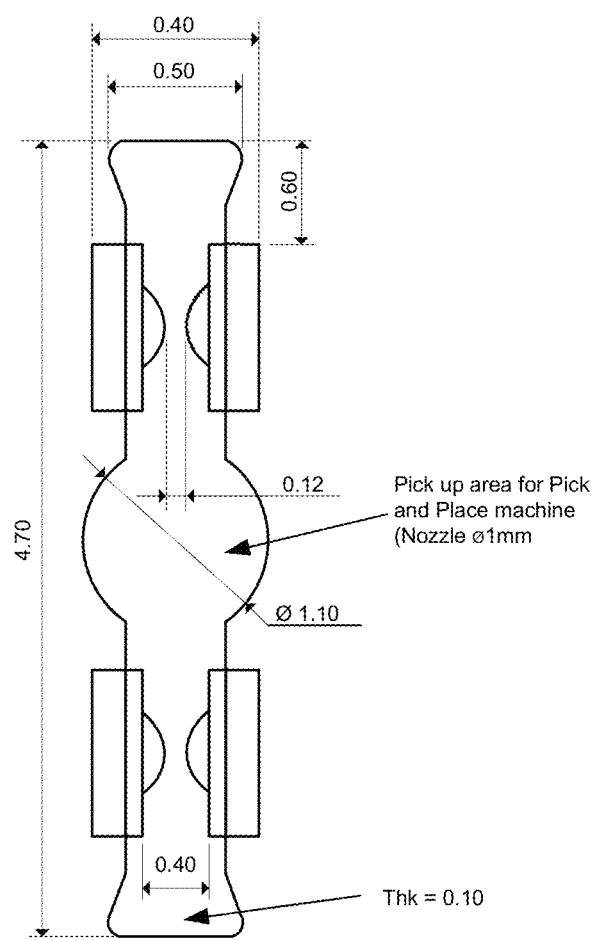
FIG. 16 depicts an illustration of a top view of an example shield clip.

FIG. 16 depicts an illustration of a top view 1600 of an example shield clip, along with various example dimensions. The shield clip includes a pick up area for a Pick and Place machine. The shield clip may be configured for a Pick and Place machine having a 1 mm diameter nozzle. Any of a variety of sizes for the pick up area may be utilized.

Conclusion

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A shield can, comprising:
   a frame including a cross-bar for installing the frame on a printed circuit board (PCB), a connection point of the cross-bar being connected to a top of a side of the frame, the connection point of the cross-bar being narrower than a bar portion of the cross-bar the frame including a burr at the connection point after removal of the cross-bar from the frame, the burr being a portion of the cross-bar left behind as a result of the removal of the cross-bar from the frame; and
   a lid to the frame for forming an electromagnetic shield for components within the frame, the lid including a hole to fit the burr.

2. The shield can of claim 1, wherein the cross-bar is connected to the frame at two connection points.

3. The shield can of claim 1, wherein the cross-bar has a bent shape when the frame is installed on the PCB such that a lower surface of the cross-bar is raised above the top of the frame and the lower surface of the cross-bar does not interfere with components within the frame.

4. The shield can of claim 1, wherein the connection point of the cross-bar is narrow to enable the cross-bar to be removed from the frame by snipping or twisting the cross-bar.

5. A shield can, comprising:
   a frame for installing on a printed circuit board (PCB) by using a cross-bar connected to the frame at one or more connection points, the frame including one or more burrs at the one or more connection points, the one or more burrs being portions of the cross-bar left behind as a result of removal of the cross-bar from the frame; and
   a lid for connecting over the frame to form the shield can around components within the frame, the lid including one or more holes that align to receive the one or more burrs at the one or more connection points.

6. The shield can of claim 5, wherein the lid is configured to be installed after the frame is installed on the PCB.

7. The shield can of claim 5, wherein the lid is connected to the frame via an adhesive.

8. The shield can of claim 5, wherein the lid is connected to the frame via a pressure-sensitive adhesive.

9. The shield can of claim 5, wherein the lid is connected to the frame via a mechanical latch.

10. The shield can of claim 9, wherein the lid includes one or more protrusions that are configured to latch with one or more indentations on the frame.

11. The shield can of claim 9, wherein lid includes one or more indentations that are configured to latch with one or more protrusions on the frame.

12. The shield can of claim 5, wherein the lid includes non-magnetic material.

13. The shield can of claim 5, wherein the lid includes a non-conductive inner surface.

14. A computing device, comprising:
   a printed circuit board (PCB);
   one or more components installed on the PCB and configured to produce an electromagnetic field; and
   a shield can providing an electromagnetic shield for the one or more components, the shield can including a lid connected to a frame installed on the PCB and around the one or more components, the frame including a burr at a connection point where a cross-bar was connected to the frame, the burr being a portion of the cross-bar left behind as a result of removal of the cross-bar from the frame, the lid including a hole for receiving the burr when connected to the frame.

15. The computing device of claim 14, wherein the frame is soldered to the PCB.

16. The computing device of claim 14, wherein a perimeter of the frame includes dimples to create the electromagnetic shield.

17. The computing device of claim 14, further comprising:
   a flexible printed circuit (FPC) installed on the PCB within the frame,
   wherein the shield can provides the electromagnetic shield over the FPC.

18. The computing device of claim 17, wherein the frame includes a gap through which a portion of the FPC can exit the shield can.

19. The computing device of claim 17, further comprising:
   a conductive foam disposed between a flange of the lid and the FPC.

20. The computing device of claim 14, wherein a size of the hole is based on an amplitude and/or frequency of a wave being shielded by the shield can.

* * * * *